Dec. 30, 1958 G. C. SZIKLAI 2,866,858

WIDE BAND SIGNAL AMPLIFIER CIRCUIT

Filed Nov. 8, 1954

INVENTOR.
GEORGE C. SZIKLAI
BY H. D. Newton
ATTORNEY

United States Patent Office 2,866,858

Patented Dec. 30, 1958

2,866,858

WIDE BAND SIGNAL AMPLIFIER CIRCUIT

George C. Sziklai, Princeton, N. J., assignor to Radio Corporation of America, a corporation of Delaware Application November 8, 1954, Serial No. 467,519

8 Claims. (Cl. 179—171)

The present invention relates generally to signal amplifier circuits and particularly to wide band signal amplifier circuits employing semiconductor devices.

Recent developments in signal communication equipments have made it necessary to provide signal translating circuits capable of signal amplification over a very wide band of frequencies. Circuits employed in radar systems and the video amplifier portion of a television receiving system are examples of circuits which must provide signal translation over a wide band of frequencies and which in addition must not introduce an excessive time delay over any portion of the signal.

The advent of semiconductor devices has, of course, resulted in their application in essentially all phases of electronic signal communication equipments including wide band signal amplifier circuits. Known semiconductor devices however have been found to be somewhat deficient in gain at higher frequencies and particularly in the frequency range required in television receiving systems. This has led to the development of semiconductor devices of the tetrode type and the "Four Terminal P–N–P–N Transistor," discussed in the Proceedings of the I. R. E., November 1952, pages 1361 through 1364, by Ebers.

An examination of the characteristic curves presented by Ebers will demonstrate that this device does not appear to exhibit the required uniformity of gain over a wide range of frequencies.

It is accordingly an object of the present invention to provide an improved semiconductor wide band signal amplifier circuit having substantially uniform gain over a wide frequency range.

It is another object of the present invention to provide an improved semiconductor wide band signal amplifier circuit having substantially uniform gain while employing a simplified and efficient circuit configuration.

It is a further object of the present invention to provide an improved wide band signal amplifier circuit effectively employing semiconductor devices and requiring a minimum of circuit elements with substantially uniform frequency response.

It is a still further object of the present invention to provide a video amplifier circuit effectively utilizing the characteristics of four terminal hook transistors for efficient, uniform, wide band signal translation.

These and other objects of the present invention are accomplished by connecting a frequency selective network in shunt with the third junction of a four terminal hook transistor. The frequency selective network is operative to control signal amplification as a function of the reciprocal of the characteristic of the network.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
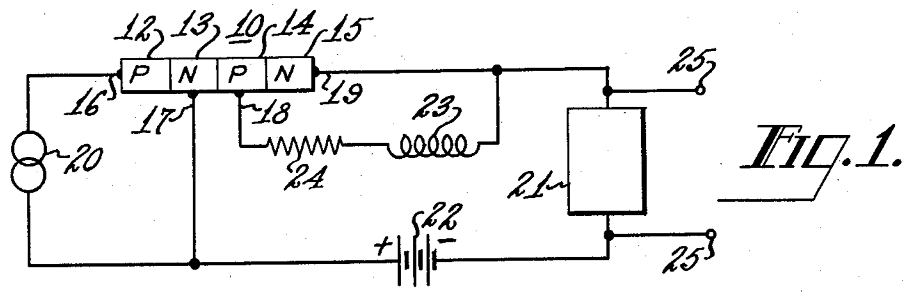
Figure 1 is a schematic circuit diagram of a wide band signal amplifier circuit employing a four terminal hook transistor in accordance with the present invention.

Referring now to the drawing wherein like components have been designated by the same reference characters throughout the various figures and referring in particular to Figure 1, a semiconductor device 10 comprising a semiconductive body of semiconductive material such as germanium having therein four contiguous zones 12, 13, 14 and 15 of opposite types of semiconductive material. Individual ohmic connections are made to the zones by conductors 16, 17, 18 and 19. The P type end zone 12 and the conductor 16 serves as the emitter and emitter electrode of the transistor 10. The N type end zone 15 and the conductor 19 serves as the collector and collector electrode of the transistor 10. The intermediate end zone 13 and the conductor 17 serve as the base and base electrode and the combination of the N type zones 13 and 15 and the intermediate P type zone 14 provide the hook collector action and current multiplication for the transistor 10 as is clearly described in the above article by Ebers.

Accordingly, an input signal may be applied from any convenient source, illustrated as an alternating current generator 20, connected between the emitter electrode 16 and the base electrode 17. Output signals may be derived from across a load impedance element, illustrated as a hollow rectangle 21, connected in series with a source of direct current energizing potential, illustrated as a battery 22, between the collector electrode 19 and the base electrode 17.

It may be noted at this time that if a low resistance connection is made between the P type intermediate zone 14 and the N type end zone 15 the transistor action which will be observed in the circuit will be essentially that of a common base connected triode semiconductor device. If, on the other hand, the external connection between the intermediate zone 14 and the end zone 15 presents a sufficiently high impedance, the junction defined by these two zones will provide current amplification as described by Ebers. An examination of the characteristics provided by such a circuit clearly indicates that the gain available over the wide range of frequencies necessary in the video amplifier section of a television receiving system is not sufficiently uniform. This difficulty is overcome in accordance with the present invention by connecting a frequency selective network such as the series arrangement of a tuning inductor 23 and a damping resistor 24 between the intermediate zone 14 and the end zone 15.

Figure 4:
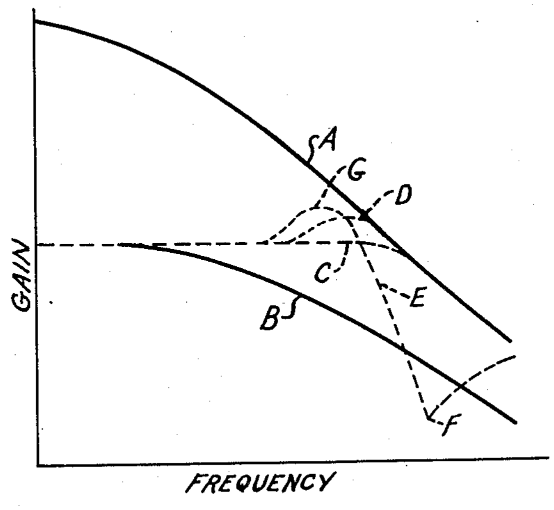
Figure 4 is a graph showing curves illustrating the gain-frequency characteristics of a four terminal hook transistor and of the signal amplifier circuits shown in Figures 1 through 3.

The improvement in the operation of the circuit which is provided by the present invention may be readily seen by reference to the graph of Figure 4 wherein the ordinate represents the signal level provided at the output terminals 25 with a predetermined and constant input signal level over a range of frequencies illustrated as the abscissa. Curve A represents the gain-frequency character of the circuit when the intermediate zone 14 and the zone 15 are externally open circuited, that is, when the external circuit presents a very high or infinite impedance. Curve B represents the gain-frequency characteristics of the circuit when the external circuit between the intermediate zone 14 and the end zone 15 consists of a resistance of the order of 2,000 ohms, and the curve C illustrates an essentially constant gain-frequency curve within the useful frequency range of the circuit, which represents the characteristic when the series arrangement of the inductor 23 and the resistor 24 is connected between the zone 14 and the end zone 15. It is readily seen from a comparison of these curves that the curves A and B would be completely unsatisfactory whereas the curve C illustrates a substantially uniform gain and accordingly satisfactory operation as required in a video signal amplifier system.

Figure 2:
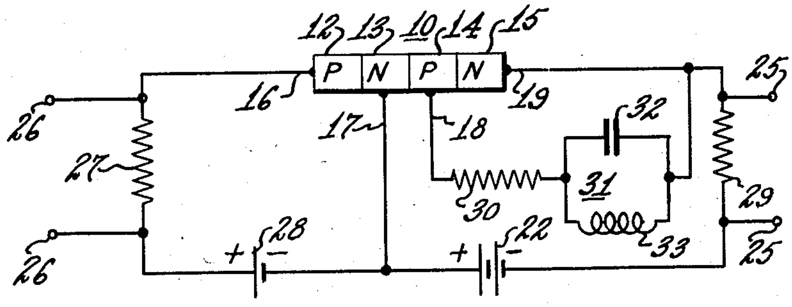
Figure 2 is a schematic circuit diagram illustrating a further embodiment of a wideband signal amplifier circuit employing a four terminal hook transistor in accordance with the present invention.

It is also within the scope within the present invention to provide additional selective amplification or selective rejection of the signal over a portion of the frequency spectrum to which a circuit is responsive. An example of an amplifier circuit provided in accordance with the present invention wherein additional gain is provided in a preselected portion of the signal frequency spectrum is illustrated in Figure 2. Accordingly, input signals may be applied from any convenient source such as from the video detector of a television receiving system to a pair of input terminals 26 which are connected across an input impedance element, illustrated as a resistor 27, connected in series with the source of energizing potential, illustrated as a battery 28, between the emitter electrode 16 and the base electrode 17. The battery 28 is poled in such a direction as to apply a forward bias across the junction defined by the P type end zone 12 and the N type intermediate zone 13.

Output signals representing an amplified replica of the input signal may be derived from the pair of output terminals 25 which are connected across a load impedance element, illustrated as a resistor 29 which is connected in series with the battery 22 between the collector electrode 19 and the base electrode 17. The battery 22 is poled in such a direction as to apply a reverse bias across the junction defined by the two intermediate zones 13 and 14, which is the collector junction of the transistor 10. It is seen therefore that the bias which is applied across the junction defined by the P type intermediate zone 14 and the N type end zone 15 is in a forward direction.

The frequency selective network which is connected between the intermediate terminal 18 and the collector electrode 19 comprises the series arrangement of a resistor 30 and a parallel resonant circuit 31. The parallel resonant circuit 31 includes a capacitor 32 and an inductor 33 which are connected in parallel and which are selected to provide a parallel resonant circuit at a predetermined frequency near or at the upper end of the signal frequency spectrum.

Curve D of the graph shown in Figure 4 represents the characteristic signal response of the circuit shown in Figure 2. The effect of the parallel resonant circuit 31 is apparent in the enhanced gain which is provided and illustrated by the additional gain evident from the curve D near the upper frequency limit of the response curve. It is accordingly possible with the circuits provided by the present invention to provide high frequency peaking over a predetermined portion of the signal frequency spectrum in order to compensate for deficiency encountered in other portions of the receiving system.

Figure 3:
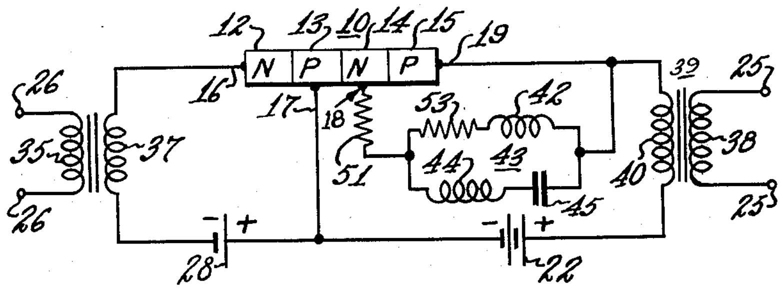
Figure 3 is a schematic circuit diagram illustrating a still further embodiment of a wide band signal amplifier circuit provided in accordance with the present invention.

It is often desirable to provide frequency selective amplification and in addition frequency selective signal rejection in order to avoid interference from undesirable signals in a particular portion of signal receiving system. Such a circuit which is provided in accordance with the present invention is illustrated in Figure 3 wherein the input terminals 26 are connected to the ends of the primary winding 35 of an input transformer 36. The input transformer 36 further includes a secondary winding 37 which is connected in series with the battery 28 between the emitter electrode 16 and the base electrode 17. Input signals which are thus applied to the transistor 10 are amplified and may be derived from the output terminals 25 which are connected to the ends of the secondary winding 38 of an output transformer 39. The output transformer 39 is also provided with a primary winding 40 which is connected in series relation with the battery 22 between the collector electrode 19 and the base electrode 17. As above discussed the battery 28 is poled in such a direction as to provide a forward bias across the emitter junction and the battery 22 is poled in such a direction as to provide a reverse bias across the collector junction.

The frequency selective network which, in accordance with the present invention, is connected between the intermediate terminal 18 and the collector electrode 19 comprises a pair of parallel branches connected in series with a resistor 51. The first parallel branch includes the series arrangement of an inductor 42 and a limiting resistor 53, and the second parallel branch comprises a series resonant circuit 43. The series resonant circuit 43 includes an inductor 44 and a capacitor 45 which may be tuned to a predetermined signal frequency so as to provide selective rejection at the predetermined frequency. It is to be noted that either or both of the resistors may be utilized to enhance the low frequency gain, and that the high frequency rejection is improved if the series resistor 51 is omitted.

The curve E shown in the graph of Figure 4 illustrates the characteristic signal response of the amplifier circuit shown in Figure 3. It is noted that the point F on the curve E represents the frequency to which the series resonant circuit is tuned and that the output signal level at this frequency is appreciably reduced from that obtainable over the remaining portion of the signal frequency spectrum. The high frequency peaking which is observed in the region of G on curve E may be attributed to the combined action of the series resonant circuit 43 and the inductor 42 which serve to provide parallel resonance at this frequency and hence a high impedance circuit.

The semiconductor signal amplifier circuit provided in accordance with the present invention may, accordingly, be utilized to provide a substantialy uniform signal response over a wide band of signal frequencies, may provide selective peaking over a predetermined portion of the signal frequency spectrum, or may provide selective signal rejection all with a minimum of circuit elements.

I claim:

1. A wide band signal amplifier circuit comprising in combination, a semiconductor device including a semiconductive body having therein a plurality of zones arranged in succession and including two end zones and at least two intermediate zones, adjacent zones being contiguous and of opposite conductivity types, a signal input circuit connected between one end zone and one intermediate zone which is contiguous therewith, a signal output circuit connected between said one intermediate zone and the other end zone, and a frequency selective network the impedance of which increases with increases of frequency over at least a portion of the frequency band of said amplifier circuit connected between said other end zone and the intermediate zone contiguous therewith providing a predetermined gain-frequency characteristic for said signal amplifier circuit.

2. A wide band signal amplifier circuit as defined in claim 1, wherein said network includes a tuning inductor and a series resonant circuit connected in parallel relation.

3. A wide band signal amplifier circuit as defined in claim 1, wherein said network includes a dampening resistor and a tuning inductor connected in series relation.

4. A wide band signal amplifier circuit as defined in claim 3, wherein capacitive means is provided in parallel with said inductor.

5. A wide band signal amplifier circuit comprising in combination, a semiconductor device including four zones of semiconductive material arranged in succession, adjacent zones being contiguous and of opposite conductivity types, said device exhibiting the characteristic of providing a current gain in excess of unity as a function of the reciprocal of the external impedance connected between one end zone and the intermediate zone contiguous therewith, means for applying an input signal and a forward bias between the other end zone and the intermediate zone contiguous therewith, means for deriving an output signal from between said one end zone and the intermediate zone contiguous with said other end zone, means for applying a forward bias between said one end zone and the intermediate zone contiguous therewith, and a frequency selective network the impedance of which increases with increases of frequency over at least a portion of the frequency band of said amplifier circuit connected between said one end zone and the intermediate zone contiguous therewith for providing a substantially uniform signal gain over a relatively wide frequency range.

6. A wide band signal amplifier circuit as defined in claim 5, wherein said network includes an inductor and a series resonant circuit connected in parallel relation.

7. A wide band signal amplifier circuit as defined in claim 5, wherein said network includes a damping resistor and a tuning inductor connected in series relation.

8. A wide band signal amplifier circuit as defined in claim 6, wherein a tuning capacitor is connected in shunt with said inductor for providing a parallel resonant circuit at a predetermining frequency.

References Cited in the file of this patent

UNITED STATES PATENTS

| | | |
|---|---|---|
| 2,655,610 | Ebers | Oct. 13, 1953 |
| 2,691,074 | Eberhard | Oct. 5, 1954 |

OTHER REFERENCES

Terman text "Radio Engineering," 3d ed., page 321, pub. 1947 by McGraw-Hill Book Co., N. Y. (Copy in Div. 69.)